United States Patent
Ogawa et al.

(10) Patent No.: US 7,893,446 B2
(45) Date of Patent: Feb. 22, 2011

(54) NITRIDE SEMICONDUCTOR LIGHT-EMITTING DEVICE PROVIDING EFFICIENT LIGHT EXTRACTION

(75) Inventors: Atsushi Ogawa, Higashihiroshima (JP); Akio Aioi, Mihara (JP); Satoshi Komada, Mihara (JP); Hiroshi Nakatsu, Amagasaki (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/022,066

(22) Filed: Jan. 29, 2008

(65) Prior Publication Data

US 2008/0179608 A1  Jul. 31, 2008

(30) Foreign Application Priority Data

Jan. 30, 2007 (JP) ............................. 2007-019647

(51) Int. Cl.
*H01L 33/00* (2010.01)
(52) U.S. Cl. ..................... 257/94; 257/97; 257/103; 257/E33.005; 257/E33.062
(58) Field of Classification Search ................. 257/94, 257/96, 97, E33.017, E33.023, 88, 103, E51.018, 257/E51.022, E51.026
See application file for complete search history.

(56) References Cited

U.S. PATENT DOCUMENTS

| 2005/0023549 A1* | 2/2005 | Gardner et al. ................. 257/99 |
| 2005/0077530 A1* | 4/2005 | Chae ............................ 257/94 |
| 2007/0029541 A1* | 2/2007 | Xin et al. ....................... 257/14 |

FOREIGN PATENT DOCUMENTS

| JP | 08-097468    | 4/1996  |
| JP | 11-340509    | 12/1999 |
| JP | 2004-179369 A | 6/2004 |
| JP | 2005-229085  | 8/2005  |
| JP | 2005-268601  | 9/2005  |
| JP | 2005-268739  | 9/2005  |
| JP | 2006-135311  | 5/2006  |

* cited by examiner

*Primary Examiner*—Hung Vu
*Assistant Examiner*—Vernon P Webb
(74) *Attorney, Agent, or Firm*—Morrison & Foerster LLP (57) ABSTRACT

A nitride semiconductor light-emitting device comprises a substrate, and a first n-type nitride semiconductor layer, an emission layer, a p-type nitride semiconductor layer, a metal layer and a second n-type nitride semiconductor layer stacked on the substrate successively from the side closer to the substrate, with an electrode provided on the surface of the second n-type nitride semiconductor layer or above the surface of the second n-type nitride semiconductor layer. The metal layer is preferably made of a hydrogen-storage alloy.

9 Claims, 6 Drawing Sheets

NITRIDE SEMICONDUCTOR LIGHT-EMITTING DEVICE PROVIDING EFFICIENT LIGHT EXTRACTION

This nonprovisional application is based on Japanese Patent Application No. 2007-019647 filed with the Japan Patent Office on Jan. 30, 2007, the entire contents of which are hereby incorporated by reference.

BACKGROUND OF THE INVENTION

1. Field of the Invention

The present invention relates to a nitride semiconductor light-emitting device, and more particularly, it relates to a nitride semiconductor light-emitting device improvable in light extraction efficiency.

2. Description of the Background Art

In the structure of a conventional nitride semiconductor light-emitting diode, serving as a nitride semiconductor light-emitting device, having a p-type nitride semiconductor layer forming a light extraction side, an electrode formed on the surface of the p-type nitride semiconductor layer must satisfy the following three conditions:

First, the electrode must have high transmittance with respect to light emitted from an emission layer of the nitride semiconductor light-emitting diode.

Second, the electrode must have sufficient resistance and a sufficient thickness to be capable of sufficiently diffusing an injected current in the plane of the emission layer.

Third, the electrode must have low contact resistance with respect to the p-type nitride semiconductor layer.

In order to satisfy the aforementioned first to third conditions, a transparent conductive film of ITO (indium tin oxide) has recently been used as an electrode provided on the surface of a p-type nitride semiconductor layer in a light extraction direction of a nitride semiconductor light-emitting diode.

In the transparent conductive film of ITO, however, photochemical properties irreversibly change under a high temperature to lower transmittance for visible light, leading to limitation of a temperature region for a process after formation of the transparent conductive film. Further, the transparent conductive film is disadvantageously deteriorated and blackened when driven with high current density.

In order to solve the aforementioned problems, Japanese Patent Laying-Open No. 08-097468, for example, discloses a method of attaining excellent ohmic contact by employing InGaN having smaller band gap energy than GaN for a p-type nitride semiconductor layer of a group III nitride semiconductor light-emitting device provided with a light extraction electrode in place of p-type GaN thereby lowering the barrier between the p-type nitride semiconductor layer and the electrode formed on the surface thereof.

Japanese Patent Laying-Open No. 11-340509 discloses a method of reducing a driving voltage by forming a p-type nitride semiconductor layer provided with an electrode in a superlattice structure obtained by alternately stacking first and second nitride semiconductor layers having different compositions and introducing In into at least the first nitride semiconductor layer in the aforementioned first and second nitride semiconductor layers.

In each of the methods disclosed in Japanese Patent Laying-Open Nos. 08-097468 and 11-340509, however, it is difficult to attain excellent ohmic contact by lowering the barrier between the p-type nitride semiconductor layer and the electrode formed on the surface thereof.

Therefore, each of Japanese Patent Laying-Open Nos. 2005-229085, 2005-268601, 2005-268739 and 2006-135311 discloses a method of forming an n-type nitride semiconductor layer constituting a tunnel junction with a p-type nitride semiconductor layer on the p-type nitride semiconductor layer and forming an electrode on the n-type nitride semiconductor layer.

According to this method, contact resistance can be reduced, a driving voltage can be lowered and high-output driving can be implemented as compared with the structure obtained by forming the electrode on the surface of the p-type nitride semiconductor layer.

In the method disclosed in each of the aforementioned Japanese Patent Laying-Open Nos. 2005-229085, 2005-268601, 2005-268739 and 2006-135311, however, light extraction efficiency is still insufficient. Therefore, further improvement of the light extraction efficiency is awaited.

SUMMARY OF THE INVENTION

Accordingly, an object of the present invention is to provide a nitride semiconductor light-emitting device improvable in light extraction efficiency.

The present invention provides a nitride semiconductor light-emitting device comprising a substrate, and a first n-type nitride semiconductor layer, an emission layer, a p-type nitride semiconductor layer, a metal layer and a second n-type nitride semiconductor layer stacked on the substrate successively from the side closer to the substrate, with an electrode provided on the surface of the second n-type nitride semiconductor layer or above the surface of the second n-type nitride semiconductor layer.

In the nitride semiconductor light-emitting device according to the present invention, the metal layer is preferably made of a hydrogen-storage alloy.

In the nitride semiconductor light-emitting device according to the present invention, a semiconductor layer containing an n-type dopant and a p-type dopant may be provided between the p-type nitride semiconductor layer and the metal layer.

In the nitride semiconductor light-emitting device according to the present invention, a semiconductor layer containing an n-type dopant and a p-type dopant may be provided between the metal layer and the second n-type nitride semiconductor layer.

In the nitride semiconductor light-emitting device according to the present invention, the semiconductor layer containing the n-type dopant and the p-type dopant may be formed by a plurality of layers.

In the nitride semiconductor light-emitting device according to the present invention, a nitride semiconductor layer having a smaller band gap than the p-type nitride semiconductor layer and the second n-type nitride semiconductor layer may be provided between the p-type nitride semiconductor layer and the metal layer.

In the nitride semiconductor light-emitting device according to the present invention, a nitride semiconductor layer having a smaller band gap than the p-type nitride semiconductor layer and the second n-type nitride semiconductor layer may be provided between the metal layer and the second n-type nitride semiconductor layer.

In the nitride semiconductor light-emitting device according to the present invention, the band gap energy of the second n-type nitride semiconductor layer is preferably larger than energy corresponding to the wavelength of light emitted from the emission layer.

According to the present invention, a nitride semiconductor light-emitting device improvable in light extraction efficiency can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. In the accompanying drawings, it is assumed that reference numerals identical to each other denote the same or corresponding portions.

First Embodiment

Figure 1:
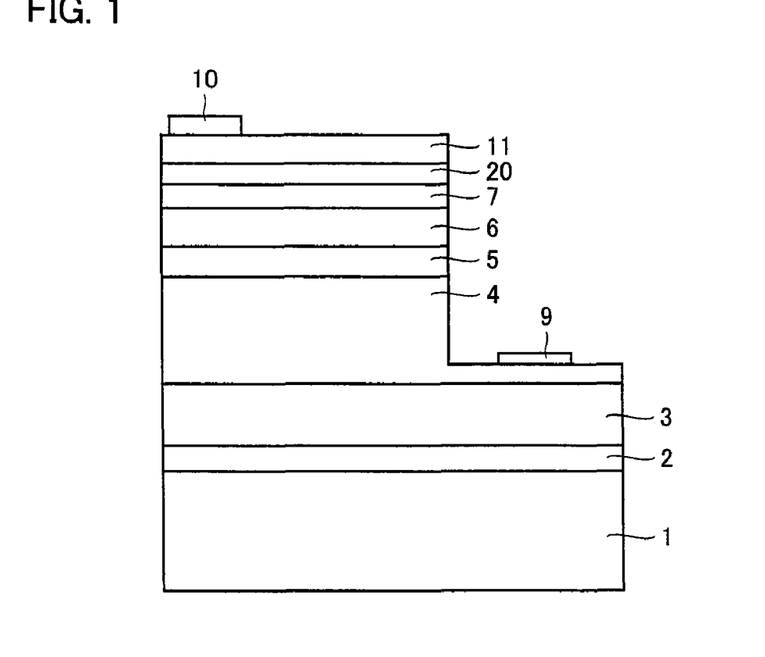
FIG. 1 is a schematic sectional view of an exemplary nitride semiconductor light-emitting diode according to the present invention.

FIG. 1 is a schematic sectional view of an exemplary nitride semiconductor light-emitting diode according to the present invention. In the nitride semiconductor light-emitting diode, a buffer layer 2 of GaN or the like, for example, an n-type nitride semiconductor underlayer 3 of n-type GaN or the like, for example, an n-type nitride semiconductor contact layer 4 of n-type GaN or the like, for example, an emission layer 5 having a multiple quantum well structure obtained by alternately stacking an $In_{0.25}Ga_{0.75}N$ layer and a GaN layer, for example, a p-type nitride semiconductor clad layer 6 of p-type AlGaN or the like, for example, a p-type nitride semiconductor contact layer 7 of p-type GaN or the like, for example, a metal layer 20 of Pd or the like, for example, and a second n-type nitride semiconductor layer 11 of n-type GaN or the like are stacked on a substrate 1 of sapphire or the like, for example, in this order. An n-side pad electrode 9 is formed on the surface of n-type nitride semiconductor contact layer 4, while a p-side pad electrode 10 is formed on the surface of second n-type nitride semiconductor layer 11.

The nitride semiconductor light-emitting diode shown in FIG. 1 is characterized in that metal layer 20 is formed between p-type nitride semiconductor contact layer 7 and second n-type nitride semiconductor layer 11.

Metal layer 20 is so formed between p-type nitride semiconductor contact layer 7 and second n-type nitride semiconductor layer 11 forming a tunnel junction as to increase the contact area (through metal layer 20) between the easily roughened surface of p-type nitride semiconductor layer 7 and second n-type nitride semiconductor layer 11. Thus, carrier paths are widened and carriers are diffused in metal layer 20, so that the carriers are injected into the surface of emission layer 5 in spread states.

In the nitride semiconductor light-emitting diode shown in FIG. 1, p-side pad electrode 10 is formed on the surface of second n-type nitride semiconductor layer 11, whereby more excellent ohmic contact is easily obtained as compared with a conventional nitride semiconductor light-emitting diode having an electrode formed on the surface of a p-type nitride semiconductor layer.

In the nitride semiconductor light-emitting diode shown in FIG. 1, further, n-type nitride semiconductor contact layer 4 provided under emission layer 5 is superior in crystallinity to the p-type nitride semiconductor layer provided under an emission layer described in Japanese Patent Laying-Open No. 08-097468, for example, whereby emission layer 5 is also improved in crystallinity, to attain high quality with high quantum efficiency.

In the nitride semiconductor light-emitting diode shown in FIG. 1, therefore, the ratio of the quantity of extractable light to the quantity of current injection remarkably increases due to the synergy of the aforementioned effects, whereby the light extraction efficiency can be remarkably improved.

Metal layer 20 is preferably made of a hydrogen-storage alloy. When metal layer 20 is made of a hydrogen-storage alloy and p-type nitride semiconductor contact layer 7 is doped with Mg (magnesium) as a p-type dopant, hydrogen having been bonded to Mg atoms is desorbed from p-type nitride semiconductor contact layer 7 and easily incorporated into metal layer 20 in treatment such as annealing, whereby the carrier concentration of p-type nitride semiconductor contact layer 7 is increased and a driving voltage is reduced. Thus, the nitride semiconductor light-emitting diode can be inhibited from temperature rise, whereby the ratio of the quantity of extractable light is remarkably increased with respect to the quantity of current injection, and the light extraction efficiency can be further improved.

The hydrogen-storage alloy employed for metal layer 20 can be prepared not only from Mg, Pd (palladium), Ti (titanium), V (vanadium) or La (lanthanum) but also from an alloy containing at least one metal selected from the group consisting of Mg, Pd, Ti, V and La.

While a current must flow in reverse bias between p-type nitride semiconductor contact layer 7 and second n-type nitride semiconductor layer 11 so that the nitride semiconductor light-emitting diode shown in FIG. 1 emits light, carriers can be moved between the valence band of p-type nitride semiconductor contact layer 7 and the conduction band of second n-type nitride semiconductor layer 11 through depletion layers by increasing the carrier concentrations in portions of p-type nitride semiconductor contact layer 7 and second n-type nitride semiconductor layer 11 closer to metal layer 20, for example. Therefore, the current can be fed in reverse bias between p-type nitride semiconductor contact layer 7 and second n-type nitride semiconductor layer 11.

An exemplary method of manufacturing the nitride semiconductor light-emitting diode shown in FIG. 1 is now described with reference to schematic sectional views shown in FIGS. 2 to 6.

Figure 2:
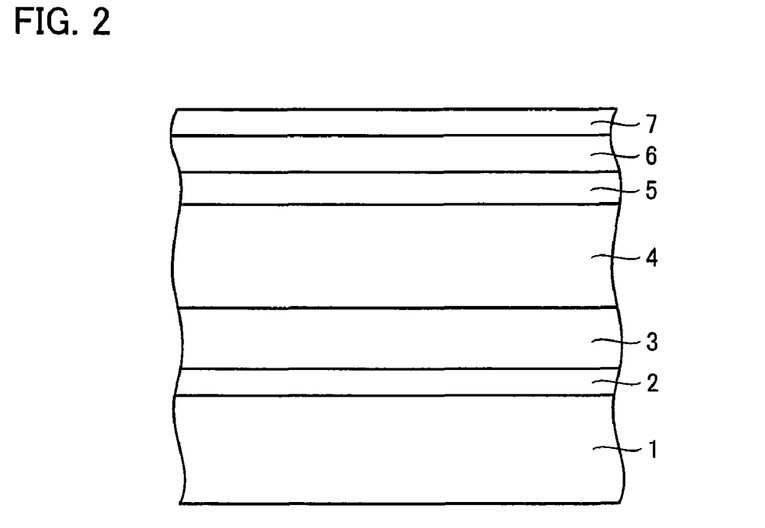
FIGS. 2 to 6 are schematic sectional views illustrating partial steps in a method of manufacturing the nitride semiconductor light-emitting diode shown in FIG. 1.

First, substrate 1 is set in an MOCVD (metal organic chemical vapor deposition) apparatus, and buffer layer 2, n-type nitride semiconductor underlayer 3, n-type nitride semiconductor contact layer 4, emission layer 5, p-type nitride semiconductor clad layer 6 and p-type nitride semiconductor contact layer 7 are crystal-grown on substrate 1 in this order by well-known MOCVD or the like, for example, as shown in FIG. 2.

Figure 3:
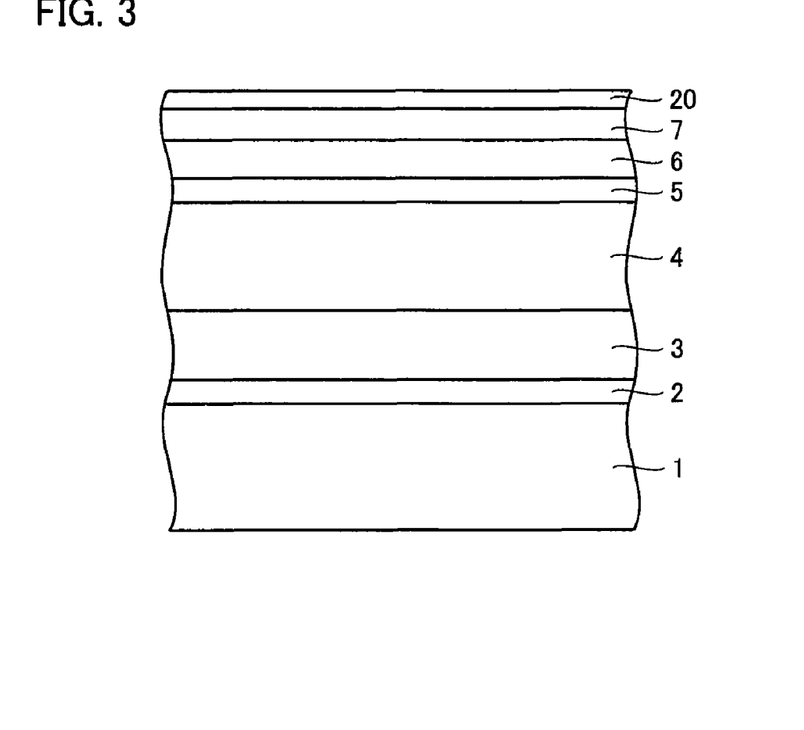

After the growth of p-type nitride semiconductor contact layer 7, the wafer is taken out from the MOCVD apparatus and set in a sputtering apparatus or an evaporation apparatus, for stacking metal layer 20 on the surface of p-type nitride semiconductor contact layer 7 by well-known sputtering or evaporation, for example, as shown in FIG. 3.

Figure 4:
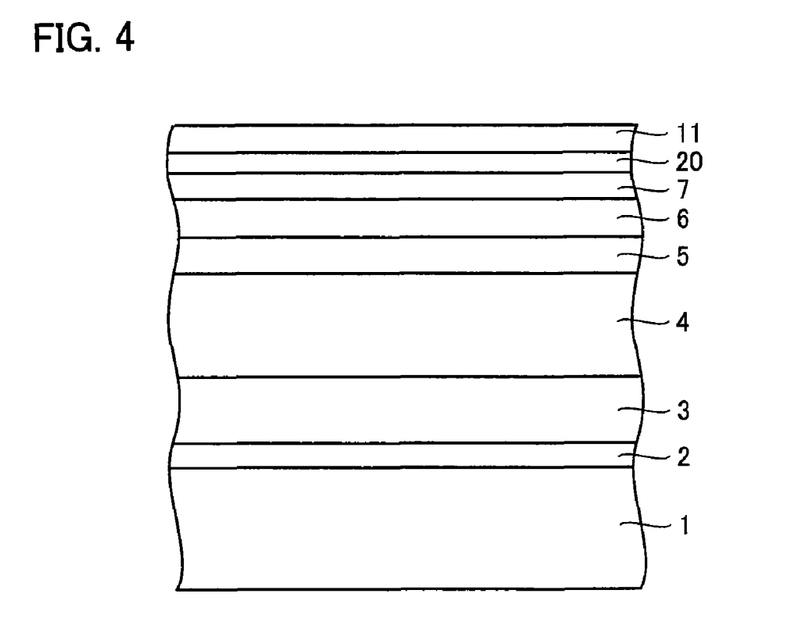

Then, the wafer provided with metal layer 20 is taken out from the sputtering or evaporation apparatus, and set in an MBE (molecular beam epitaxy) apparatus. Thereafter second n-type nitride semiconductor layer 11 is grown on the surface of metal layer 20 by well-known MBE, for example, as shown in FIG. 4. While MBE is employed as the method of growing second n-type nitride semiconductor layer 11 on the surface of metal layer 20 in this embodiment, well-known MOCVD or PLD (pulse laser deposition), for example, may alternatively be employed in place of MBE in the present invention.

Figure 5:
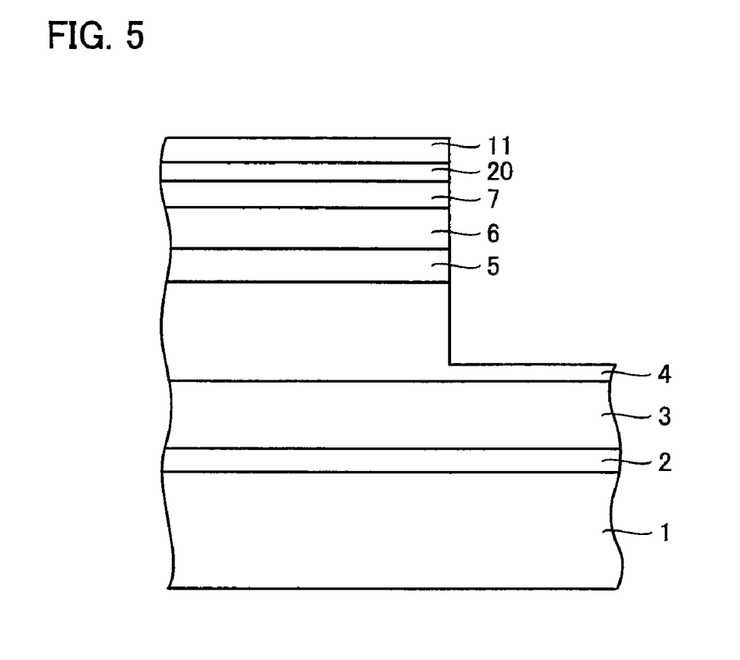

Then, the wafer provided with second n-type nitride semiconductor 11 is partially removed by etching or the like, thereby exposing the surface of n-type nitride semiconductor layer 4 as shown in FIG. 5.

Figure 6:
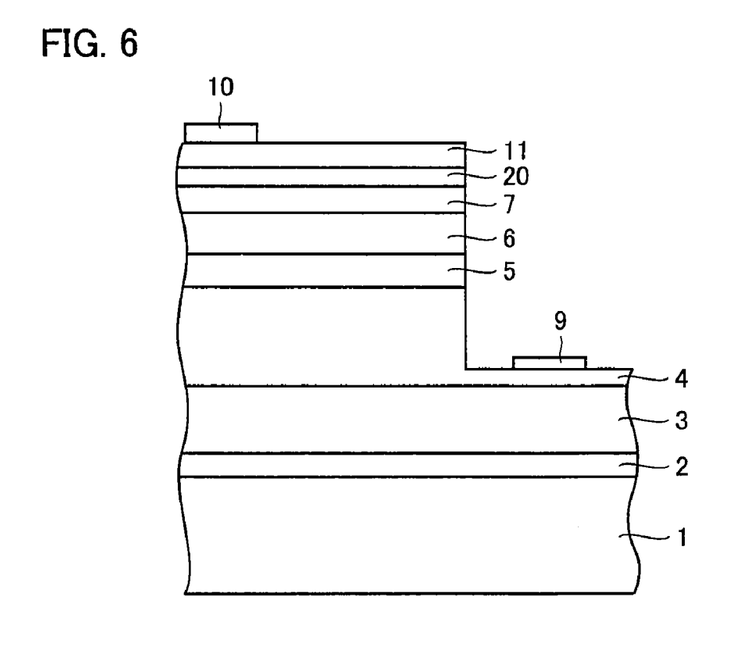

Then, n-side pad electrode 9 and p-side pad electrode 10 are formed on the exposed surface of n-type nitride semiconductor contact layer 4 and the surface of second n-type nitride semiconductor layer 11 respectively, as shown in FIG. 6.

Thereafter the wafer provided with n-side pad electrode 9 and p-side pad electrode 10 is divided into a plurality of chips, thereby obtaining the nitride semiconductor light-emitting diode shown in FIG. 1.

Second Embodiment

Figure 7:
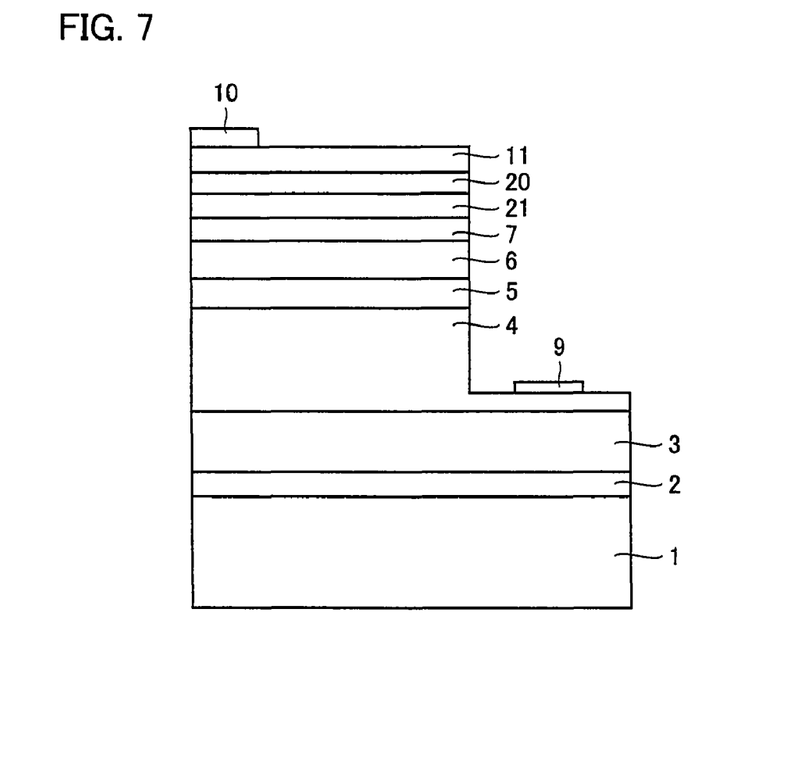
FIGS. 7 to 12 are schematic sectional views of exemplary nitride semiconductor light-emitting diodes according to the present invention respectively.

FIG. 7 is a schematic sectional view of an another exemplary a nitride semiconductor light-emitting diode according to the present invention. The nitride semiconductor light-emitting diode shown in FIG. 7 is characterized in that a semiconductor layer 21 doped with both of an n-type dopant and a p-type dopant is provided between a p-type nitride semiconductor contact layer 7 and a metal layer 20.

Thus, when semiconductor layer 21 doped with both of an n-type dopant and a p-type dopant is provided between p-type nitride semiconductor contact layer 7 and metal layer 20, planarity is increased and crystallinity is improved as compared with a semiconductor layer doped with only a p-type dopant, whereby carriers easily spread in the plane of an emission layer 5, and a nitride semiconductor light-emitting diode having high light extraction efficiency can be obtained.

Semiconductor layer 21 can be formed by a nitride semiconductor layer of InGaN or the like grown by feeding TMG (trimethyl gallium), TMI (trimethyl indium) and $NH_3$ (ammonia) as raw material gases into an MOCVD apparatus while feeding $Cp_2Mg$ (cyclopentadienyl magnesium) and $SiH_4$ (monosilane) as dopant gases, for example.

The remaining portions of the second embodiment are similar to those of the first embodiment.

Third Embodiment

Figure 8:
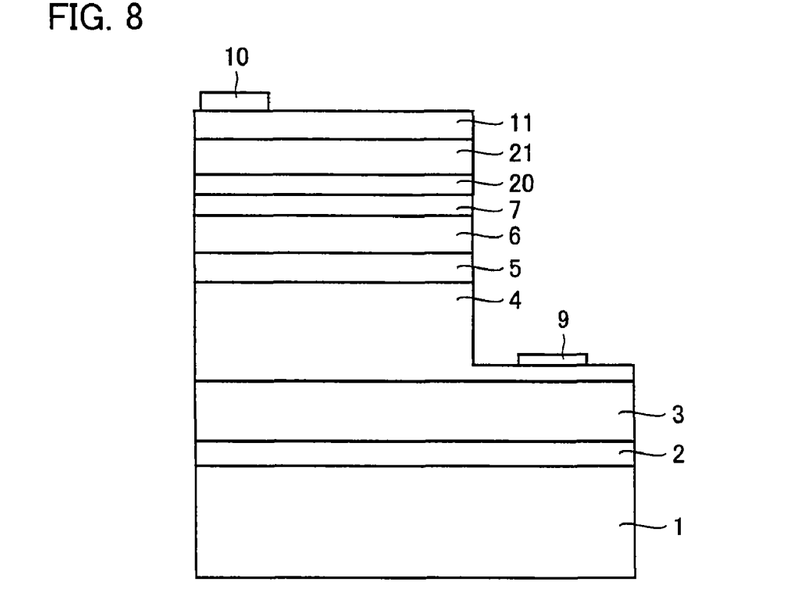

FIG. 8 is a schematic sectional view of an another exemplary nitride semiconductor light-emitting diode according to the present invention. The nitride semiconductor light-emitting diode shown in FIG. 8 is characterized in that a semiconductor layer 21 doped with both of an n-type dopant and a p-type dopant is provided between a metal layer 20 and a second n-type nitride semiconductor layer 11.

Thus, when semiconductor layer 21 doped with both of an n-type dopant and a p-type dopant is provided between metal layer 20 and second n-type nitride semiconductor layer 11, a potential drop between a p-type nitride semiconductor contact layer 7 and second n-type nitride semiconductor layer 11 can be reduced and increase in driving voltage for the nitride semiconductor light-emitting diode can be suppressed. While the reason for this is not obvious, it is inferred that this is because carriers move between the valence band of p-type nitride semiconductor contact layer 7 and the conduction band of second n-type nitride semiconductor layer 11 through p-type impurity levels and defect levels in semiconductor layer 21 doped with both of an n-type dopant and a p-type dopant and a current easily flows in reverse bias.

Semiconductor layer 21 can be formed on metal layer 20 by well-known MBE, for example. Alternatively, nitride semiconductor layer 21 can be formed by well-known MOCVD or PLD, for example, in place of MBE.

The remaining portions of the third embodiment are similar to those of the first and second embodiments.

Fourth Embodiment

Figure 9:
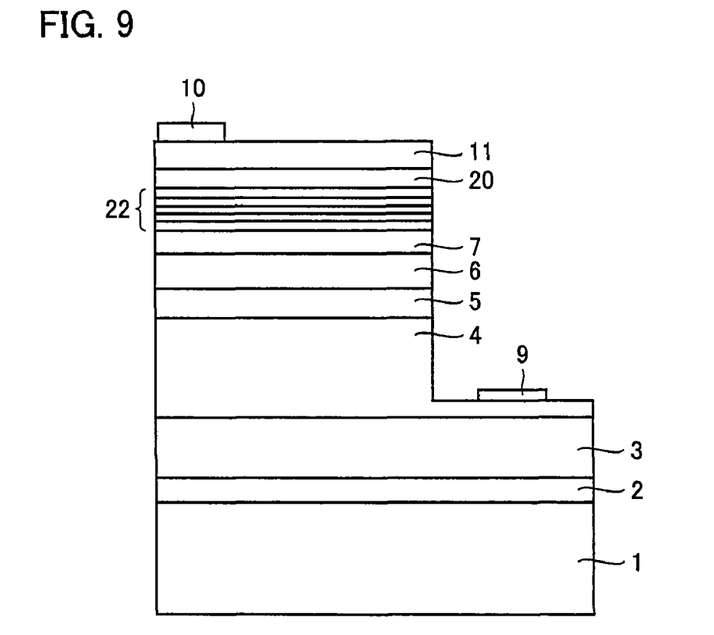

FIG. 9 is a schematic sectional view of an another exemplary nitride semiconductor light-emitting diode according to the present invention. The nitride semiconductor light-emitting diode shown in FIG. 9 is characterized in that a semiconductor layer 22 formed by alternately stacking layers doped with an n-type dopant and a p-type dopant respectively is provided between a p-type nitride semiconductor contact layer 7 and a metal layer 20.

Thus, when semiconductor layer 22 formed by alternately stacking layers doped with an n-type dopant and a p-type dopant respectively is provided between p-type nitride semiconductor contact layer 7 and metal layer 20, a second n-type nitride semiconductor layer 11 superior in crystallinity can be formed, whereby carriers easily spread in the in-plane direction of second n-type nitride semiconductor layer 11. Consequently, a nitride semiconductor light-emitting diode having high light extraction efficiency can be obtained.

Semiconductor layer 22 can be formed by a layer obtained by alternately stacking at least one p-type nitride semiconductor layer and at least one n-type nitride semiconductor layer, for example.

The remaining portions of the fourth embodiment are similar to those of the first to third embodiments.

Fifth Embodiment

Figure 10:
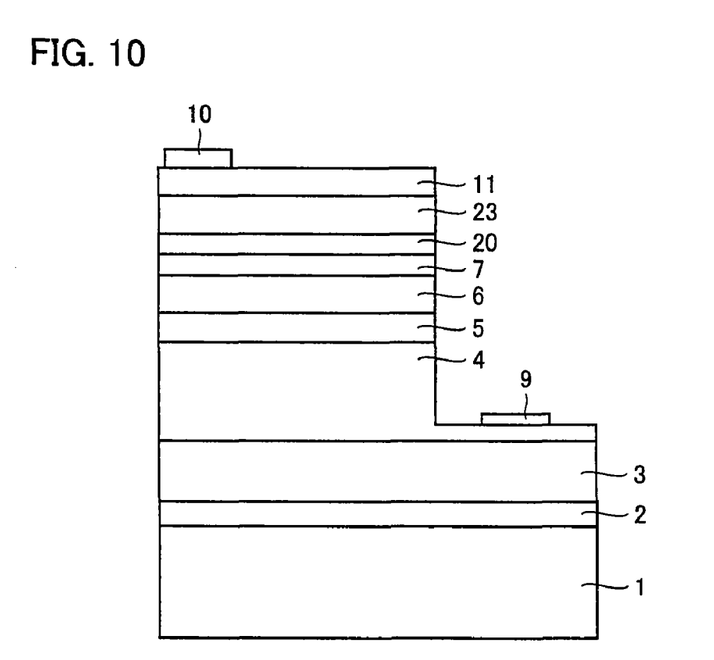

FIG. 10 is a schematic sectional view of an another exemplary nitride semiconductor light-emitting diode according to the present invention. The nitride semiconductor light-emitting diode shown in FIG. 10 is characterized in that a nitride semiconductor layer 23 having a smaller band gap than a p-type nitride semiconductor contact layer 7 and a second n-type nitride semiconductor layer 11 is provided between a metal layer 20 and second n-type nitride semiconductor layer 11.

Thus, when nitride semiconductor layer 23 having a smaller band gap than p-type nitride semiconductor contact layer 7 and second n-type nitride semiconductor layer 11 is provided between metal layer 20 and second n-type nitride semiconductor layer 11, carriers can be moved between the valence band of p-type nitride semiconductor contact layer 7 and the conduction band of second n-type nitride semiconductor layer 11 with smaller potential difference.

In this case, therefore, a driving voltage for the nitride semiconductor light-emitting diode can be reduced, whereby it is inferred that the nitride semiconductor light-emitting diode can be inhibited from temperature rise, the ratio of the quantity of extractable light is increased with respect to the quantity of current injection and the light extraction efficiency can be improved.

Nitride semiconductor layer 23 can be formed on metal layer 20 by well-known MBE, for example. Alternatively, nitride semiconductor layer 23 can be formed by well-known MOCVD or PLD, for example, in place of MBE.

The remaining portions of the fifth embodiment are similar to those of the first to fourth embodiments.

Sixth Embodiment

Figure 11:
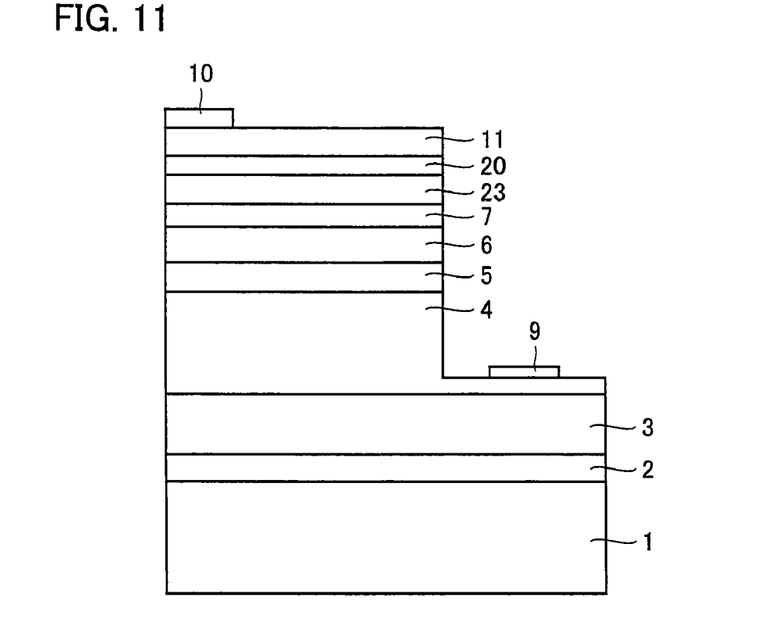

FIG. 11 is a schematic sectional view of an another exemplary a nitride semiconductor light-emitting diode according to the present invention. The nitride semiconductor light-emitting diode shown in FIG. 11 is characterized in that a nitride semiconductor layer 23 having a smaller band gap than a p-type nitride semiconductor contact layer 7 and a second n-type nitride semiconductor layer 11 is provided between p-type nitride semiconductor contact layer 7 and a metal layer 20.

Thus, also when nitride semiconductor layer 23 having a smaller band gap than p-type nitride semiconductor contact layer 7 and second n-type nitride semiconductor layer 11 is provided between p-type nitride semiconductor contact layer 7 and metal layer 20, carriers can be moved between the valence band of p-type nitride semiconductor contact layer 7 and the conduction band of second n-type nitride semiconductor layer 11 with smaller potential difference.

Also in this case, therefore, a driving voltage for the nitride semiconductor light-emitting diode can be reduced, whereby it is inferred that the nitride semiconductor light-emitting diode can be inhibited from temperature rise, the ratio of the quantity of extractable light is increased with respect to the quantity of current injection and the light extraction efficiency can be improved.

The remaining portions of the sixth embodiment are similar to those of the first to fifth embodiments.

Seventh Embodiment

Figure 12:
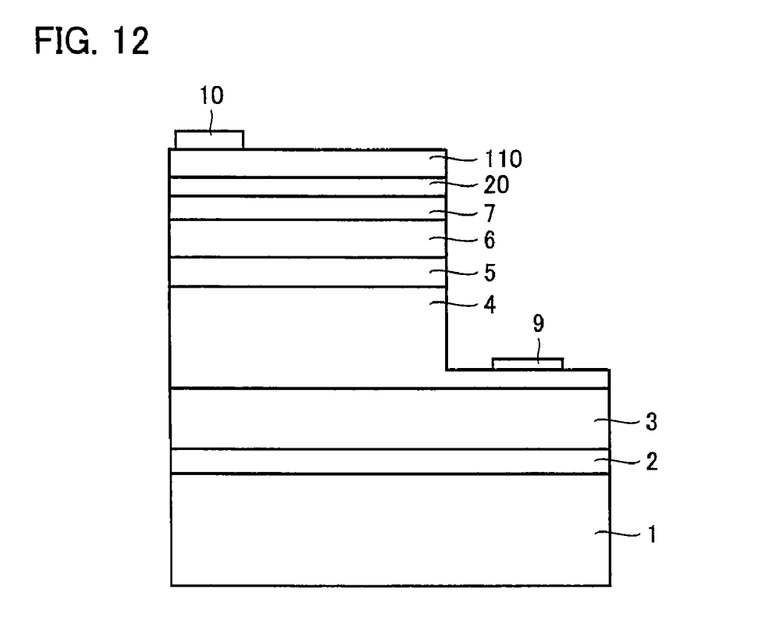

FIG. 12 is a schematic sectional view of an another exemplary a nitride semiconductor light-emitting diode according to the present invention. The nitride semiconductor light-emitting diode shown in FIG. 12 is characterized in that a second n-type nitride semiconductor layer 110 having band gap energy larger than energy corresponding to the wavelength of light emitted from an emission layer 5 is provided on a metal layer 20.

Thus, when the band gap energy of second n-type nitride semiconductor layer 110 is larger than the energy corresponding to the wavelength of the light emitted from emission layer 5, the light emitted from emission layer 5 is hardly absorbed by second n-type nitride semiconductor layer 110, whereby it is inferred that the light extraction efficiency of the nitride semiconductor light-emitting diode can be further improved.

Second n-type nitride semiconductor layer 110 can be formed on metal layer 20 by well-known MBE, for example. Alternatively, second n-type nitride semiconductor layer 110 can be formed by well-known MOCVD or PLD, for example, in place of MBE.

The remaining portions of the seventh embodiment are similar to those of the first to sixth embodiments.

The present invention is applicable to a nitride semiconductor light-emitting device such as a nitride semiconductor light-emitting diode or a nitride semiconductor laser device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising:
   a substrate; and
   a first n-type nitride semiconductor layer;
   an emission layer;
   a p-type nitride semiconductor layer;
   a conductive metal layer; and
   a second n-type nitride semiconductor layer,
   said layers being stacked on said substrate successively in recited order from a side closer to said substrate,
   wherein an electrode is provided on a surface of said second n-type nitride semiconductor layer or above the surface of said second n-type nitride semiconductor layer.

2. The nitride semiconductor light-emitting device according to claim 1, wherein said metal layer is made of a hydrogen-storage alloy.

3. The nitride semiconductor light-emitting device according to claim 1, wherein a semiconductor layer containing an n-type dopant and a p-type dopant is provided between said p-type nitride semiconductor layer and said metal layer.

4. The nitride semiconductor light-emitting device according to claim 3, wherein said semiconductor layer is formed by a plurality of layers.

5. The nitride semiconductor light-emitting device according to claim 1, wherein a semiconductor layer containing an n-type dopant and a p-type dopant is provided between said metal layer and said second n-type nitride semiconductor layer.

6. The nitride semiconductor light-emitting device according to claim 5, wherein said semiconductor layer is formed by a plurality of layers.

7. The nitride semiconductor light-emitting device according to claim 1, wherein a nitride semiconductor layer having a smaller band gap than said p-type nitride semiconductor layer and said second n-type nitride semiconductor layer is provided between said p-type nitride semiconductor layer and said metal layer.

8. The nitride semiconductor light-emitting device according to claim 1, wherein a nitride semiconductor layer having a smaller band gap than said p-type nitride semiconductor layer and said second n-type nitride semiconductor layer is provided between said metal layer and said second n-type nitride semiconductor layer.

9. The nitride semiconductor light-emitting device according to claim 1, wherein the band gap energy of said second n-type nitride semiconductor layer is larger than energy corresponding to the wavelength of light emitted from said emission layer.

* * * * *